United States Patent [19]

Miracky et al.

[11] Patent Number: 4,904,340
[45] Date of Patent: Feb. 27, 1990

[54] LASER-ASSISTED LIQUID-PHASE ETCHING OF COPPER CONDUCTORS

[75] Inventors: Robert F. Miracky, Cedar Park; Kantesh Doss, Austin, both of Tex.; Bryan Seppala, Renton, Wash.

[73] Assignee: Microelectronics and Computer Technology Corporation, Austin, Tex.

[21] Appl. No.: 264,564

[22] Filed: Oct. 31, 1988

[51] Int. Cl.$^4$ .......................... C23F 1/02; B44C 1/22; C03C 15/00; C03C 25/06

[52] U.S. Cl. .................................. 156/643; 156/656; 156/666; 156/345; 156/902; 219/121.69; 219/121.85; 252/79.2; 252/79.4

[58] Field of Search ............... 156/635, 643, 654, 656, 156/666, 345, 901, 902; 219/121.68, 121.69, 121.8, 121.84, 121.85; 252/79.2, 79.4; 204/129.3; 29/846; 437/228, 245; 427/53.1, 96

[56] References Cited

U.S. PATENT DOCUMENTS

| | | | |
|---|---|---|---|
| 3,412,032 | 11/1968 | Jenks | 252/79.4 |
| 4,283,259 | 8/1981 | Melcher et al. | 204/129.3 |
| 4,395,302 | 7/1983 | Courduvelis | 156/666 X |
| 4,401,509 | 8/1983 | Schellinger | 252/79.4 X |
| 4,518,456 | 5/1985 | Bjorkholm | 156/626 |

OTHER PUBLICATIONS

Gutfeld, "Laser-Enhanced Plating and Etching for Microelectronic Applications", IEEE Circuits and Devices Magazine, Jan. 1986, pp. 57-60.
Silversmith, "Laser Direct Write Technologies as Tools for Gate-Array Development", Mat. Res. Soc. Symp. Proc., vol. 29, 1984, pp. 55-59.
J. Tsao, "Laser-Controlled Wet Chemical Etching for Corrective Trimming of Thin Films", J. Electrochem. Soc., vol. 133, No. 11, Nov. 1986, pp. 2244-2248.
Tuckerman, "Laser-Patterned Interconnect for Thin-Film Hybrid Water-Scale Circuits", IEEE Electron Device Letters, vol. EDL-8, No. 11, Nov. 1987, pp. 540-543.
Jensen, "Copper-Polyimide Materials System for High Performance Packaging", IEEE Transactions on Components, Hybrids, and Manufacturing Technology, vol. CHMT-7, No. 4, Dec. 1984, pp. 384-393.
Hart, "Bright Dipping and Etching of Copper-Based Materials in Solutions of Sulphyric Acid and Hydrogen Peroxide, Trans. Inst. Metal Finishing", vol. 61, 1983, pp. 46-49.
Luke, "Etching of Copper with Sulphuric Acid/Hydrogen Peroxide Solutions", Trans. Inst. Metal Finishing, vol. 62(3), 1984, pp. 81-82.

*Primary Examiner*—William A. Powell
*Attorney, Agent, or Firm*—Fulbright & Jaworski

[57] ABSTRACT

A process for laser-assisted liquid phase etching of copper conductors which includes the use of a solution of sulfuric acid and hydrogen peroxide in contact with an integrated circuit substrate and the provision of a laser beam to select substrate areas having copper conductors to be etched. Also disclosed is an apparatus for the laser-assisted etching.

19 Claims, 5 Drawing Sheets

LASER-ASSISTED LIQUID-PHASE ETCHING OF COPPER CONDUCTORS

BACKGROUND OF THE INVENTION

The present invention relates to a process for laser-assisted liquid phase etching, and particularly to an improved etchant solution for use in such etching process.

Laser-assisted etching is a technique of increasing interest and application in the area of microelectronics, especially in circuit repair and maskless customization of generic circuit interconnects. Laser-assisted, liquid phase etching is a process whereby a narrow laser beam acts to heat a workpiece surface in the presence of an etching solution, and thereby selectively enhances the chemical-etchability thereof. The activity is restricted to the region of the workpiece where the beam is incident. Typically, the process is focused on the removal of select segments of the underlying wiring ("conductors") of the circuit chip or package.

The advent of high-density inter-chip interconnect technologies presents new problems for the application of laser etch methods. The fabrication of monolithic multi-chip substrates (MCS's) for integrated circuits is a sufficiently complex process in which some amount of repair of defective interconnects is necessary for economic manufacture. For example, it may be necessary to locally etch completely through the thickness of a conductor at a particular point along its length, in order to electrically disconnect two portions of the original circuit configuration. Such a need may arise if one conductor is inadvertently connected, or "shorted", to an adjacent conductor. It is also desirable to rewire connections in order to implement design changes in the substrate, after it has been fabricated and tested. This may also be preferentially performed by localized etching.

The demanding requirements of localization (8-30 micron linewidths) for repairing conductor lines suggest that localizable energy sources are appropriate tools to initiate and control repair process technologies. Laser beams are preferable to particle beams, such as electron or focused ion beams, by virtue of the much larger particle fluxes (greater beam-assisted process rate) which can be readily achieved.

The advantages of laser-assisted chemical etching (including both gas and liquid-phase etching) has already been demonstrated. Laser-assisted chemical etching to date has been concerned with conductors made from aluminum, titanium/gold, molybdenum, polycrystalline silicon and tungsten, among others. For example, Tuckerman (D. B. Tuckerman, *IEEE Elec. Dev. Letter*, EDL-8,540 (1987)) described the utility of laser gas-phase etching in forming chip-to-substrate interconnects for gold-on-silicon dioxide substrates. Also, Tsao and Ehrlich (J. Y. Tsao and D. J. Ehrlich, *Appl. Phys. Letter* 43, 46 (1983)) and J. Y. Tsao and D. J. Ehrlich, *J. Electrochem Soc.* 133, 2244 (1986)) investigated liquid phase etching of 1-$\mu$m thick aluminum lines in a mixture of nitric and phosphoric acids, as might be appropriate for photomasks and on-chip interconnects. However, this latter etch chemistry and process is highly specific to aluminum of refractory oxide substrates, and is not necessarily applicable to other metals and dielectric systems.

Furthermore, the application intended for this aluminum etch is the repair of quartz photomasks for which the aluminum conductors are only a few hundred nanometers thick. Since the optimal laser irradiation conditions depend significantly on the thickness and width of the conductors to be etched, as well as the substrate material, an entirely different set of conditions are required to permit the successful etch of different conductors of different dimensions.

A particularly preferred material combination utilized in the fabrication of MCS's, particularly medium-film MCS's having film thicknesses and widths greater than about one micron but less than about 30 microns, is copper on polyimide. Copper conductors have low resistivity and are comparatively inexpensive to fabricate. Polyimide has a comparatively low dielectric constant and can be formed into thick, planarizable layers which are necessary to achieve a low cross-talk, controlled-impedance interconnect. The thermal properties of copper and polyimide make laser etching the preferred means of a cutting copper on polyimide. In particular, the fact that the melting point of copper (1080° C.) is much higher than the decomposition temperature of the polyimide on which it is situated (400°-500° C.) rules out thermal ablation - it is unlikely that the conductors could be cut by melting the copper, without severely damaging the underlying polyimide.

The presently known laser-assisted chemical etching techniques, which are highly material and process specific, are inapplicable for etching copper/polyimide interconnect substrates. Accordingly, there exists a need for a laser-assisted, liquid-phase etching process for etching copper conductors patterned onto polyimide layers.

SUMMARY OF THE INVENTION

It is, therefore, an object of the present invention to provide a process for laser etching copper conductors on polyimide dielectric layers.

Another object of the present invention is to provide a process of the above type having a sufficiently high etch rate in the area to be etched and a sufficiently low etch rate in the non-irradiated areas ("background etch rate").

Yet another object of the invention is to provide a solution for use in the above laser-assisted etching technique which provides for advantageous etching of copper on a polyimide base.

Still another object of the invention is to provide an apparatus for laser-assisted chemical etching of copper conductors on a polyimide dielectric base.

In accomplishing the foregoing objects, there is provided, in accordance with one aspect of the present invention, a process for laser-assisted liquid-phase etching of copper conductors, comprising the steps of immersing a substrate having copper conductor lines over a dielectric in an etchant solution comprising sulfuric acid and hydrogen peroxide, and irradiating select copper wires at select areas with a focused laser beam. In a preferred embodiment, the solution comprises about two to ten percent per volume of sulfuric acid and about one to four percent per volume of hydrogen perioxide. The laser beam preferably pulsates during irradiation, for example, for intervals of approximately 10 ms. The wavelength of the laser beam is within the range of about 200-1400 nm and preferably in the visible range of 400-700 nm in order to minimize the absorption of the laser beam energy in the etch solution.

In a preferred embodiment, the process also includes a step in which a metal layer, not etchable in the sulfuric acid/hydrogen peroxide solution, is present between the copper conductor and the dielectric to prevent damage to the dielectric during irradiation. A preferred metal is titanium. Advantageously, a second non-etchable metal layer is applied to the sides of the conductors prior to etching to reduce propagation of the heat resulting from focused laser beam between adjacent conductors. Besides titanium, other "refractory" metals such as tungsten, molybdenum and tantalum, can be used.

In accordance with another aspect of the present invention, there is provided a copper etchant solution, comprising about two to ten percent per volume sulfuric acid and about one to four percent per volume hydrogen peroxide. Preferably, the solution comprises about two percent per volume sulfuric acid and about one percent per volume hydrogen peroxide, or alternatively, about ten percent per volume sulfuric acid and about two percent per volume hydrogen peroxide.

The present invention provides for the laser-assisted liquid phase etching of copper which has been applied to a dielectric at etching rates of up to 5 $\mu$m/s and background etching rates of about 1 $\mu$m/hr. The copper etch rate using the sulfuric acid/hydrogen peroxide etchant system can be adjusted over a wide range by altering compositions and/or temperatures. Additionally, the sulfuric acid/hydrogen peroxide system is transparent at visible wavelengths.

Further objects, features and advantages of the present invention will be apparent from a review of the detailed description of preferred embodiments, when considered with the figures of drawing, a brief description of which follows.

DETAILED DESCRIPTION OF PREFERRED EMBODIMENTS

Figure 1:
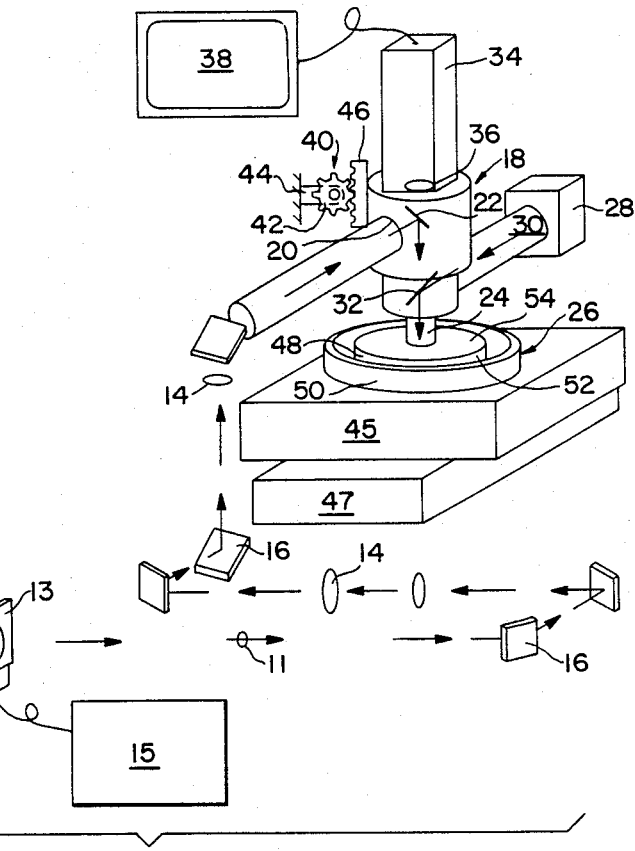
FIG. 1 is a schematic illustration of an apparatus useful in carrying out the etching of the present invention.

Referring to FIG. 1, there is shown an apparatus for performing the present invention. The apparatus includes a laser system 10 which is comprised of a laser source 12 which emits a laser beam 11, depicted in the figure by a series of broken arrows, lenses 14 for expanding and focusing the beam 11 and mirrors 16 for reflecting and redirecting the beam. Positioned downstream of the laser source 12 is a mechanical shutter 13. The shutter 13 is electronically controlled by a shutter controller 15. The shutter provides for the passage of the laser beam in short pulses. The shutter controller permits precise setting of pulse conditions (e.g., duration and repetition rate). Optionally, a neutral density filter 17 is positioned immediately downstream of the laser source. The use of the filter depends on the power of the laser source and the size of the conductor to be etched, among other factors.

The beam is directed into and through a microscope 18. The microscope includes a port 20 for receiving the beam and passing same to a beam splitter 22 positioned centrally within the microscope. A portion of the beam then passes downwardly through the microscope through an objective 24 before passing into the workcell 26.

The microscope also includes an illumination source 28. The illumination sorce lights the workcell in order that the etching operation in the workcell can be viewed. A light beam is passed from the source 28 through a second port 30 to a beam splitter 32 and down into the workcell 26. A television camera of film recorder 34 is positioned on a cylinder 36. Attached to the recorder 34 is a projection screen 38 which projects the etching taking place in the workcell 26.

The microscope is vertically positioned by means of a rack and pinion mechanism 40. The pinion 42 is securely fixed to a mount 44 which, in turn, is fixed at a selected height. The pinion engages a rack 46 mounted on the microscope. Vertical adjustment is achieved by rotating the pinion and thereby engaging the rack to either raise or lower the microscope.

The workcell 26 is securely mounted on translation tables 45 and 47 which displace the workcell in the X-Y plane relative to the fixed laser beam. The movement of the tables is controlled by a computer control unit (not shown) to displace the workcell so that the laser beam is incident along a predetermined path on the surface of the workpiece within the workcell.

In one embodiment, the workcell 26 includes an inner container 48 encircled by an outer container 50. The inner container 48 comprises a round base 52 which is open at the top and which receives a lid 54. The workcell is shown in more detail in FIG. 2.

Figure 2:
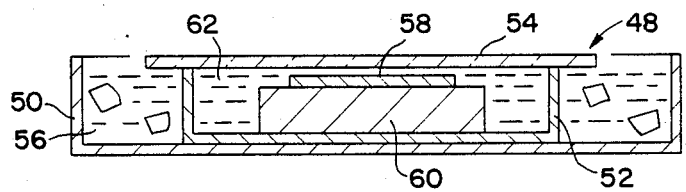
FIG. 2 is a cross-sectional side view of the workpiece container of the apparatus of the present invention.

As FIG. 2 illustrates, the outer container 50 cotains a coolant solution 56, for example, an ice bath, which surrounds and aids in cooling the solution 62 in the container 48. The inner container 48 houses the workpiece 58 on which the etching is done. The workpiece 58 is positioned on a pedestal 60 which positions the workpiece just below the lid 54.

The container 48 is filled with solution. As a result, once the lid 54 is placed on the container, no gas bubbles can form therein and the solution surface is planarized. Both characteristics enhance the accuracy of the etching by reducing incidental reflection.

Figure 3:
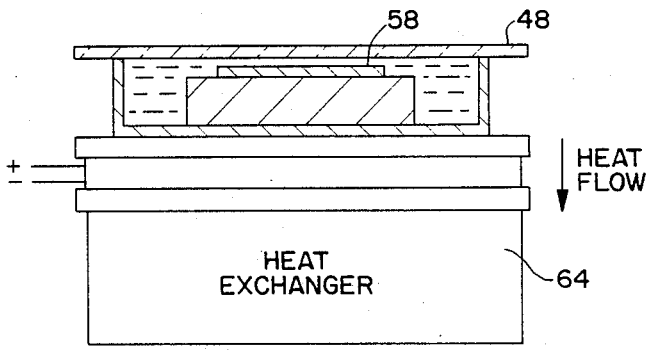
FIG. 3 is a partial cross-sectional view of the workpiece container with a temperature control means according to the present invention.

FIG. 3 is a cross-sectional view of the container 48 illustrating a means 63 for controlling the temperature of the container. The temperature control means can be an ice bath or a thermoelectric cooler, for example. The means serves to keep the solution at a sufficiently cool temperature to facilitate advantageous etching rates. Chemical-etching conditions, especially temperature, as established in the workcell such that without laser irradiation, etching takes place slowly, if at all. It is desirable that the solution be held at a relatively low temperature, e.g., in the range between about $-5°$ C. and $5°$ C., preferably at or below about $0°$ C. For example, the background etch rate for the 2%/1% solution is 1.1 $\mu$m/hr at $0°$ C. (see Table I).

As previously mentioned, the solution is static, with the surface thereof kept as level as possible to assure proper passage of the beam through the solution to the workpiece.

Particularly preferred solutions are dilute solutions of sulfuric acid/hydrogen peroxide. The solution contains about 2-10% sulfuric acid and about 1-4% hydrogen peroxide; particularly preferred are solutions of about 2% sulfuric acid and about 1% hydrogen peroxide or about 10% sulfuric acid and about 2% hydrogen peroxide. The 2%/1% formulation provides especially preferred properties, possibly because the lower sulfate ion ($HSO_4$) concentration is less likely to inhibit the highly localized diffusion of reactant species at the laser etch sites, which is especially significant at lower temperatures. The above solutions were found to have high temperature etch rates equal to or greater than about 1 $\mu$m/s and background etch rates less than or equal to about 1 $\mu$m/hr, both advantageous properties for laser etching copper interconnect circuitry.

In comparison, ferric chloride and chromic acid solutions are unsuitable because they etch copper too quickly and result in a higher than acceptable level of "background" etching. Ammonium persulfate, an example of a copper pre-clean etchant, has a low etch rate which is relatively insensitive to temperature. As a consequence, one would not expect laser etching to be advantageous using ammonium persulfate.

The etch of copper in sulfuric acid and hydrogen peroxide is a three step process. Sulfuric acid along etches copper only very weakly; however, it etches cupric oxide quite rapidly. Hydrogen peroxide is added to sulfuric acid to serve as an oxidizing agent, first forming cuprous oxide:

$$2Cu + H_2O_2 \rightarrow Cu_2O + H_2O \tag{1}$$

Cuprous oxide is subsequently oxidized to form cupric oxide by further reacting with $H_2O_2$:

$$Cu_2O + H_2O_2 \rightarrow 2CuO + H_2O \tag{2}$$

Once CuO is formed, it readily enters solution:

$$CuO + H_2SO_4 \rightarrow CuSO_4 + H_2O \tag{3}$$

For the dilute etch solutions of interest in the present invention, reactions (1) and (2) ae the rate determining steps.

The laser beam, in being absorbed by the workpiece, acts as a narrow thermal beam to heat the etchant solution in a localized area on the workpiece. This localized heating thereby selectively activates the interface of the etching solution and workpiece to enhance the chemical etching of the copper conductors of the workpiece. The beam can be focused to control the size of the localized etching. By displacing the laser beam or the workpiece, the chemical etching occurs on the workpiece selectively along the path of displacement of the laser beam relative to the workpiece. Thus, an etching pattern is defined by the size of the beam and the path of displacement.

According to the present invention, the requisite laser beam has (a) output power of at least about 1 watt in the wavelength range of about 200-1400 nm, preferably in the visable range of about 400-700 nm, and (b) a continuous duration of laser beam emission of at least about 1 ms, but preferably as long as about 1 s. Requirement (a) is necessary because the laser light must pass through the solution without much absorption in the liquid. Water and most clear aqueous solutions are highly transparent in this wavelength range. Both requirements can be satisfied by continuous wave (CW) argon ion laser operating in all lines mode, for which the dominant visible wavelengths are in the range of about 457 nm and 530 nm. Alternatively, the laser could be operated in single line mode. The 514.5 nm and 488 nm lines contain the most energy, so they are preferably. Other lasers which satisfy the requirements include: (i) Nd: YAG laser (operating at either about 1064 or about 532nm); (ii) CW dy laser, operated in the range of about 400-700 nm; and (iii) CW krypton ion laser, operated in the range of about 400-700 nm; and (iv) an eximer laser operated in the range from about 200-350 nm.

The focused beam should not be wider than the conductor wires to be etched. This is necessary to prevent damage to the underlying polyimide on either side of the conductor wires. Widths of about 8-30 microns are typical wire widths for medium film MCS's.

Additionally, the beam should be shuttered at a sequence of intervals of approximately 1 to 20 ms, preferably about 10 ms, until the line is completely severed.

The duration of pulses and the interval between consecutive pulses are determined by the constraint that any gas which is evolved in the laser etch process must not adhere to the sample surface at the etch site. Under laser heated conditions, the local temperature is likely to be much higher than the bulk boiling point of the solution, which is close to 100° C. If the laser pulse duration is too long, significant nucleate boiling occurs, resulting in formation of a bubble at the etch site. However, by applying the laser energy in short pulses, separated by intervals long enough for any gas which has evolved to diffuse away from the etch site, this adverse side effect can be avoided. Pulses of about 10 ms, separated by intervals of about 100 ms, are acceptable.

The process is particularly useful with polyimide as the dielectric. Other dielectric materials, however, can be used. These dielectrics include epoxy, silicon dioxide, and silicon nitride, for example.

The process is useful in its broadest sense for all system having copper on polyimide and is not limited to a particular geometry. However, it is particularly useful for medium-film MCS's as previously mentioned—"medium-film" being used to means film thicknesses and widths greater than about one micron, but less than about 30 microns. The process and attendant solution can also be used on other forms and sizes of electronic circuitry, for example, conventional printed circuit boards, taper for tape automated bonding (TAB) and printed wiring boards.

Also, the above discussion has focused on the utility of the invention for etching copper wires of an interconnect. While this is a primary application, the system can also be used to etch any variety of copper geometries including vias, i.e., interlayer connections between vertically stacked wiring levels, connectors used with TAB-lead frames and other copper circuitry.

The etchant solution can include one or more other additives depending on the process criteria. For example, a surfactant may be added to inhibit the formation of gas bubbles (arising either from the boiling of $H_2O$ or the decomposition of $H_2O_2$ into $H_2O$ and $O_2$). This is advantageous since the laser etch process is retarded in the event that a large bubble adheres to the copper surface at the etch site.

A copper corrosion inhibitor can also be added. An example of such an inhibitor is ammonium -, potassium -, sodium-thiocyanate. The addition of a corrosion inhibitor may permit the practical operation of the laser etch process at room temperature, rather than at some controlled cooler temperature. Preferably, the inhibitor is present in amounts from about 0.02 to 0.2%.

Also, a substance can be added which stabilizes the concentration of $H_2O_2$. An example of such a substance is hypoxanthine. Advantageously, the hypoxanthine is present in the range from about 0.2–0.5%. Stabilization of the $H_2O_2$ concentration is useful since $H_2O_2$ decomposes gradually with time. A stabilizer reduces this decomposition rate significantly.

Figure 4A:
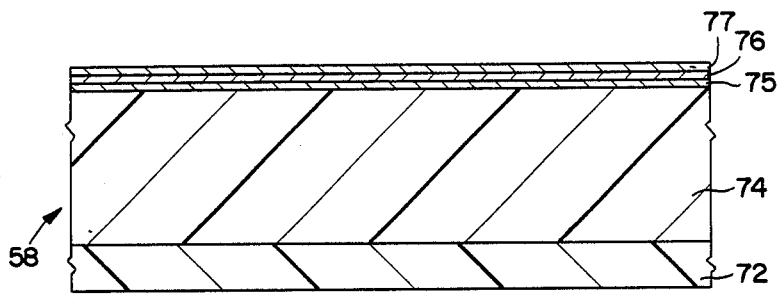
FIGS. 4A-4D are schematic cross-sectional side views of the inteconnects to be etched according to the present invention.

FIGS. 4A–4D illustrate the workpiece 58 in more detail and depict the process steps by which the workpiece is prepared for etching. The workpiece is an interconnect which comprises an underlying substrate 72 supporting a dielectric polyimide layer 74. It has been discovered that advantageous properties are provided by the addition of layers of material to the polyimide. The materials should not be etchable in the sulfuric acid/hydrogen peroxide solution. Preferred materials include titanium and chromium. Particularly preferred is titanium which will be discussed below. FIG. 4A schematically illustrates the addition of these layers. Firstly, layers of titanium, copper and titanium 75, 76 and 77, respectively, are sputtered onto the surface of the polyimide 74 prior to electroplating of the copper lines. The bottom Ti layer 75 aids adhesion, the Cu layer 76 supplies cathode current and the top Ti layer 77 prevents corrosion of the copper between sputtering and electroplating of the conductive copper wires. The top Ti layer 77 is stripped prior to electroplating; layers 75 and 76 are stripped after electroplating.

Figure 4B:
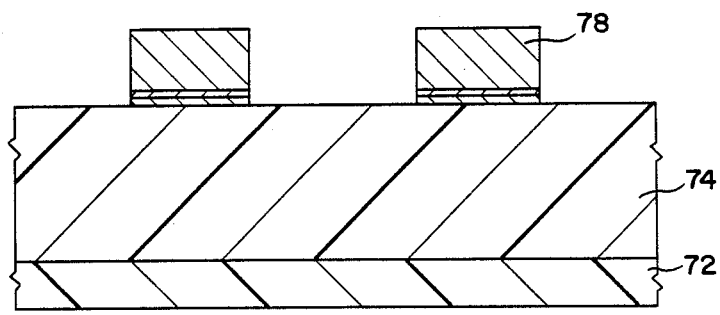
Figure 4C:
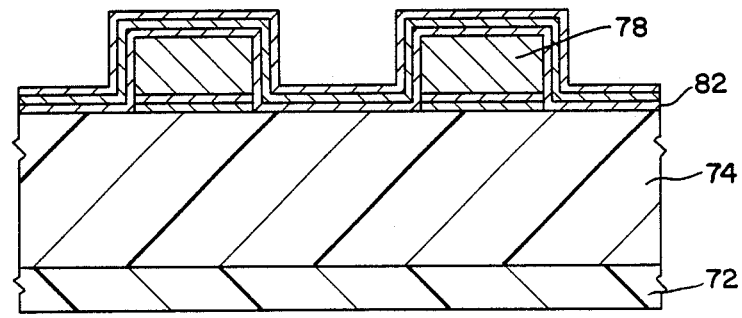

FIG. 4B shows the workpiece after the copper conductors 78 have been plated and patterned. FIG. 4C illustrates additional advantageous processing. According to this preferred embodiment, the polyimide layer 74 is covered with an additional layer of material 80 after the copper lines 78 have been electroplated and patterned. This addition, of course, is differentiated from the Ti/Cu/Ti layer described above which is deposited prior to copper electroplating. The material 80 can be selected from titanium and chromium. Again, titanium is preferred and will be discussed below.

It may be practical to apply the Ti layer 80 in the form of the Ti/Cu/Ti composite layers discussed above. This is because the application means may be set up to deliver the three layers and it would not be efficient to have to alternate between the two applications. FIG. 4C shows the application of three layers for that very reason.

Figure 4D:
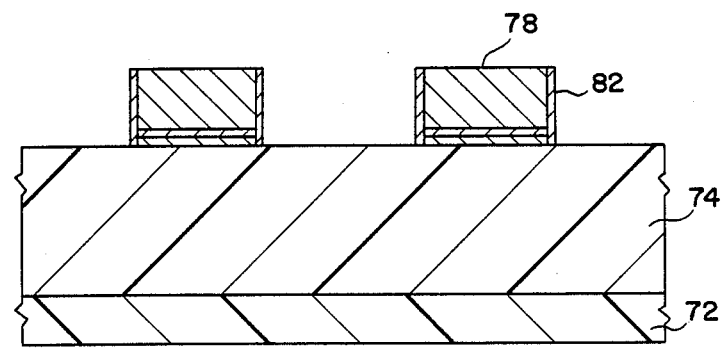

The subsequent Ti layer serves to prevent the copper conductors from corroding between fabrication of MCS samples and laser etching. The Ti is stripped from the top surface of the copper conductors; however, a residual thickness of the Ti remains along the sides of the copper conductors. This occurs because there is anisotropic etching of the Ti surface. FIG. 4D illustrates such a structure 82. The presence of these "ribbons" of Ti along the sides of the conductors reduces the amount of laser-assisted etching which would otherwise occur at conductors adjacent to the one upon which the laser is focused. This, in turn, permits the laser etch process to be applied to MCS's with a smaller spacing between conductors, i.e., a higher density interconnect. It will be apparent that the method, apparatus and solution of the present invention is useful for etching a medium-film interconnect.

Figure 5:
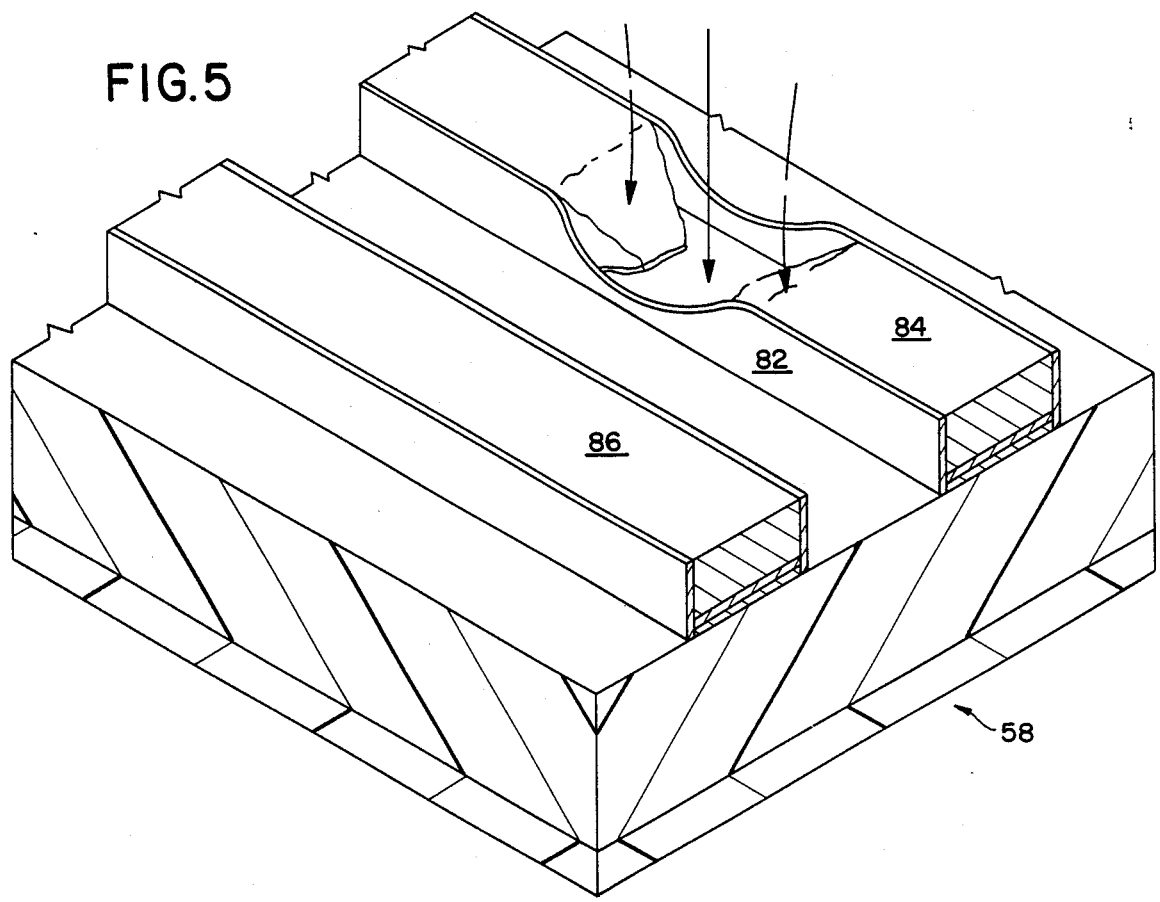
FIGS. 5-6 are isometric views of interconnects after etching.
Figure 6:
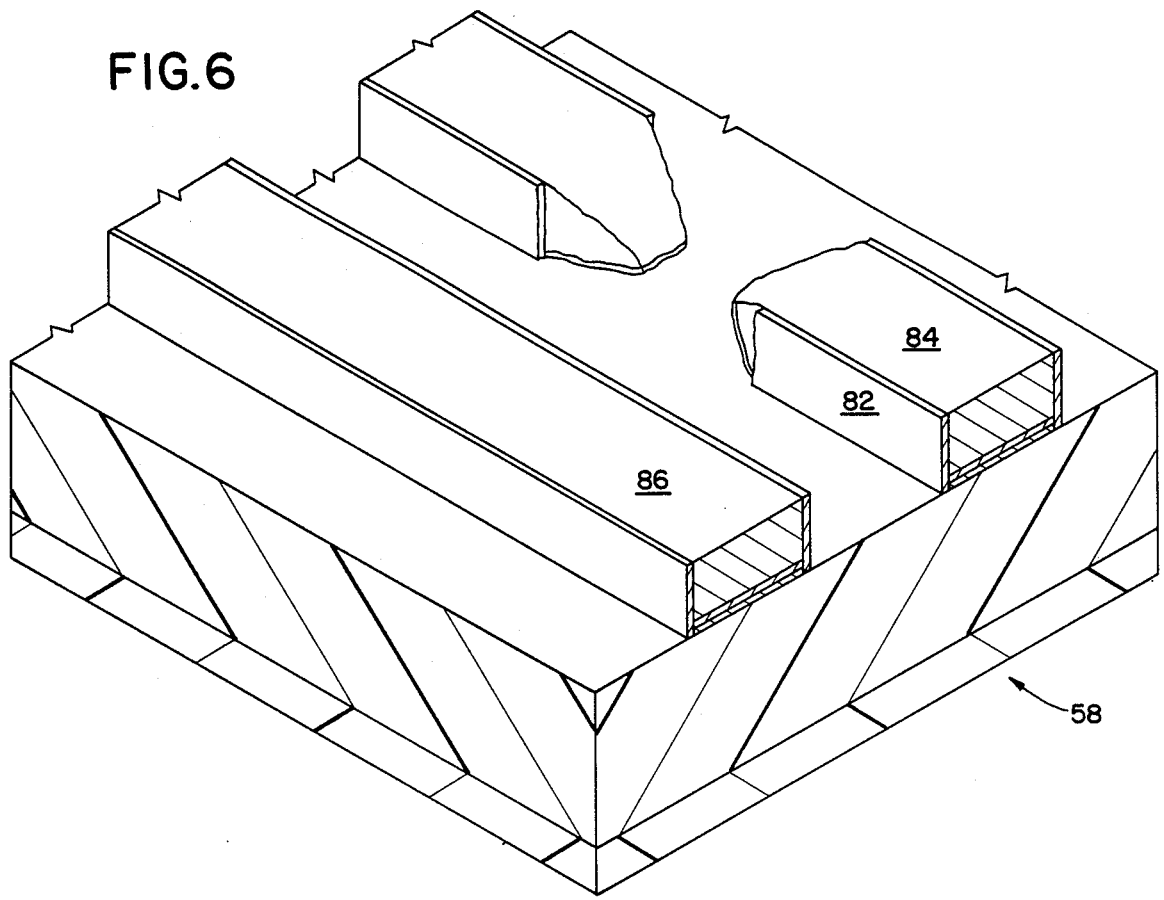

FIGS. 5 and 6 illustrate the actual etching process and the resulting copper structure. Laser pulses are focused by the microscope objective 24 onto the interconnect 58 at a select area of the copper conductor 84. The etch is shown completed with a break in conductor shown. The sidewalls of titanium 82 are shown somewhat slightly deformed; however, they are not etched during laser exposure. As previously mentioned, these sidewalls reduce the amount of etching which would otherwise occur at the adjacent conductor 86.

After laser etching, the bottom Ti layer 77 remains intact, as Ti is not etched in $H_2SO_4/H_2O_2$. The Ti layer can be selectively stripped (without etching either the copper or polyimide) by immersion in dilute solution of, for example, hydrofluric acid, subsequent to laser etching of the copper. The advantage of such an addition is that the presence of the Ti layer prevents the underlying dielectric from reaching its decomposition temperature, after the last trace of copper has been laser etched. This Ti layer serves to dissipate heat resulting from the absorbed laser light. FIG. 6 illustrates the etched copper conductor 84 of FIG. 5 after the sidewalls 82 and bottom Ti layer 75 have been removed.

Thus, advantageous etching of copper conductors in inteconnects can be achieved by the use of laser etching in a sulfuric acid/hydrogen peroxide solution. The advantages of the present invention will be illustrated further by the following example.

EXAMPLE

An optical system was constructed which comprised a 5W CW argon ion laser operated in the single-line mode at 488 nm. The beam was mechanically shuttered to provide short pulses whose duration was approximately 10 ms. The beam was attenuated, expanded and then introduced into one port of a multi-port microscope head. The beam was focused by means of a 20× objective to a diameter of about 10 μm. The sample was imaged with a high resolution black and white vidicon camera placed into a second port of the microscope. A computer-controlled X-Y translation stage was used to translate and position the sample relative to the fixed laser beam.

The samples used in the laser etching consisted of copper lines, approximately 6 μm thick and 14 μm wide, patterned over a layer of polyimide. The copper conductors were electroplated over sputtered layers of Ti and Cu, which served as adhesion layer and cathode contact, respectively. In a departure from conventional processing, these samples were finally coated with layers of Ti, Cu, and Ti. This protected the surface of the patterned copper layer from corrosion, permitting long-term storage of pre-fabricated samples. The Ti, Cu, and Ti layers were then selectively etched from the top surface of the conductors just prior to laser etch experiments to expose the copper conductors (Ti ribbons remained on the sides of the conductors).

For each laser etch experiment, a 1 sq. in. section was cut from one of the samples and placed in a glass dish filled to the brim with the etch solution which had been precooled to about 2° C. The glass dish was then surrounded by ice, covered with a glass window, and mounted underneath the laser microscope on the X-Y stage. Once the conductor to be etched was centered underneath the beam, a sequence of laser pulses was applied to its surface, until the conductor had been completely etched through both its width and its thickness. Pulses of 10 ms duration were determined to be long enough to result in sufficient etching, yet short enough, when operated with a 10% duty factor, to ensure that the amount of gas liberated in a single pulse was too small to form bubbles which might adhere to the surface at the etch site. Once the laser etching had been concluded, the sample was removed from the etchant, cleaned and dried. Since Ti is not etched by $H_2SO_4/H_2O_2$, the underlying Ti adhesion layer was exposed once the copper had been removed. This layer was subsequently stripped in a dilute solution of HF.

In order to identify particular compositions of the etchant solution which have low background etch rates (no larger than about 1 micron/hr), background etch rates were measured for several different concentrations of $H_2SO_4$ and $H_2O_2$, over the temperature range 0°–90° C. (no laser is involved here). Fresh etchant solutions were prepared for each trial, as the $H_2O_2$ in solution slowly decomposes into $H_2O$ and $O_2$. A stabilizing agent could be added to retard this process. Average etch rates at temperatures in the range 25°–90° C. were inferred from weight loss measurements. At 0° C., stylus profilometry was used instead, due to the low etch rates. Measurements using the two methods at 25° C. agreed to within 5%. The foil surfaces were pre-cleaned by etching in 2% $H_2SO_4$/2% $H_2O_2$ for two minutes immediately prior to the initial weight or thickness determination.

Figure 7:
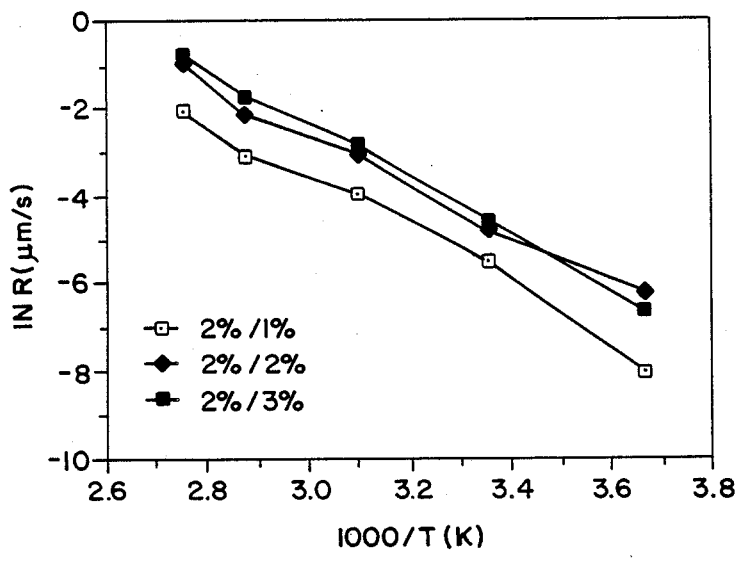
FIG. 7-8 are graphs reflecting copper etch rates according to the present invention.
Figure 8:
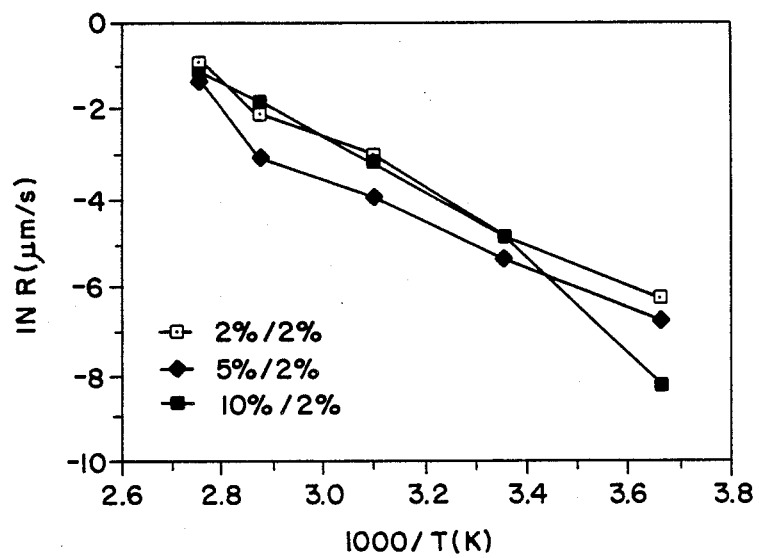

The logarithm of the etch rate versus inverse temperature is plotted in both FIG. 7 (several $H_2O_2$ concentrations, 2% $H_2SO_4$ concentration) and FIG. 8 (several $H_2SO_4$ concentrations, 2% $H_2O_2$ concentration). From the linear character of the curves in FIG. 7 for temperatures above 25° C., the etch rate dependence on temperature is nearly "Arrhenius-like", in the sense that the linear slope describes an average activation energy, for the combination of reactions (1) and (2) above. Furthermore, the etch rate increases monotonically with $H_2O_2$ concentration, as one might expect if the copper oxidation steps were in fact etch-rate limiting. A more complicated process is involved for higher $H_2SO_4$ concentrations, as is indicated by the curves in FIG. 8. For temperatures above 25° C., the etch rates for the 10% and 2% $H_2SO_4$ concentrations show Arrhenius-like behavior. However, there appears to be a relative minimum in the etch rate versus $H_2SO_4$ concentration, as the etch rate for 5% $H_2S_2O_4$ is below that for both 10% and 2%.

Arrhenius-like activation energies $E_a$ were extracted from the background etch rate data, and are summarized in Table I.

TABLE I

ETCH RATES AND ACTIVATION ENERGIES FOR VARIOUS ETCHANT COMPOSITIONS

| Concentrations | | $E_A$ | $E_A$ | Rate 0° C. | Rate 25° C. | Extrap Rate. 150° C. |
|---|---|---|---|---|---|---|
| $H_2SO_4$ | $H_2O_2$ | 25–90° C. | 0–50° C. | | | |
| (vol. %) | | (eV) | (eV) | (μm/hr) | (μm/hr) | (μm/s) |
| 10 | 2 | 0.52 | 0.78 | 1.0 | 29 | 3.3 |
| 5 | 2 | 0.53 | 0.42 | 4.3 | 17 | 1.7 |
| 2 | 2 | 0.53 | 0.49 | 6.8 | 28 | 3.6 |
| 2 | 1 | 0.48 | 0.64 | 1.1 | 14 | 1.0 |
| 2 | 3 | 0.54 | 0.59 | 4.7 | 36 | 5.1 |
| 1.5 | 1.5 | 0.52 | 0.52 | 3.3 | 19 | 2.2 |
| 1 | 1 | 0.42 | 0.39 | 5.5 | 24 | 0.78 |

For temperatures above 25° C., and for $H_2O_2$ concentrations above 1%, the activation energy is nearly constant, with a value of 0.53 +/− 0.01 eV. At lower temperatures, there is no such uniformity. Also included in Table I are extrapolations of the 25°–90° C. etch rates to 150° C. Conservatively estimating, it is believed that laser-heated conductor lines immersed in a liquid etchant can reach this temperature without significant bubble formation. Indeed, Tsao and Ehrlich report laser-heating temperatures exceeding 200° C. Six of the seven solutions investigated possessed extrapolated etch rates which were greater than 1 μm/s. None of the samples had etch rates less than 1 μm/hr at 25° C.. However, upon cooling to 0° C., both the 2%/1% and 10%/2% solutions did achieve etch rates less than 1 μm/hr.

Figure 9:
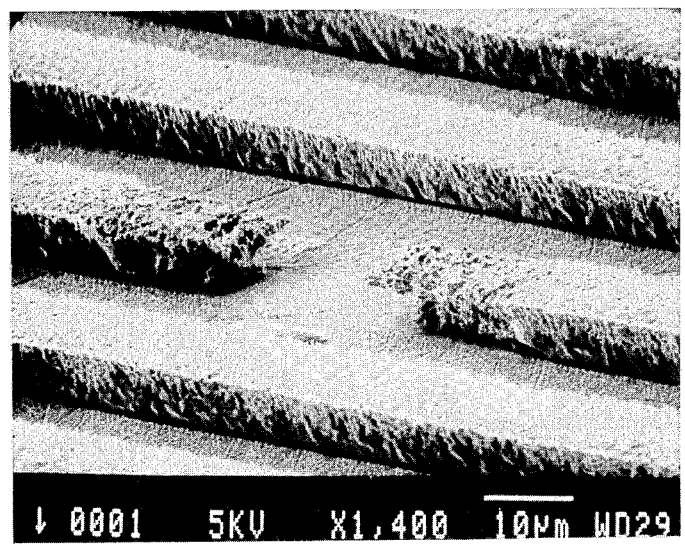
FIG. 9-10 are micrographs of a laser-etched interconnect according to the present invention.

In light of the low background etch rate measured for the 2%/1% solution (see Table I), this etchant was selected for extensive laser etch experiments. FIG. 9 is a scanning electron micrograph of a 6-μm thick, 14-μm wide copper line which has been laser etched with the 2%/1% solution in the manner described above. With an incident laser power density of about 88 kW/sq.cm. and a beam diameter of 10 μm, a sequence of 239 10 ms pulses (with a 10% duty factor) was required to etch through the 14 μm wide line. The average etch rate was then 6 μm/(239×10 ms), or 2.5 μm/s. This rate is higher than the extrapolated rate at 150° C. of 1.0 μm/s in Table I, suggesting that either the laser-heated temperature was greater than 150° C., or the temperature dependence of the etch rate is steeper above 90° C. For these 6-μm thick, 14-μm wide lines, etching is observed over a 50-μm interval along the length of the line. This reflects the fact that the extend of etching is determined by the steady-state temperature profile in the laser-heated copper. Of course, etching of thinner or narrower lines might be confined to a smaller lateral region.

Experiments were also performed under similar circumstances with a 1%/1% solution. An average laser-assisted etch rate of 5.0 μm/s was achieved. Here, however, the background etch rate was 8 μm/hr at 5° C., consistent with the Table I measurement of 5.5 μm/hr at 0° C. Since it does not have as low a background etch rate, the 1%/1% solution would not be as useful for practical applications.

The Ti ribbons 82 in FIG. 5 are visible in FIG. 9. It was noted that as long as the etch opening in the copper is large enough, the Ti ribbons in the laser etch region will be removed during the final Ti adhesion layer strip at the end of the process, as was the case for the sample of FIG. 9. The background etch rate, indicated by the protrusion of the Ti ribbons above the copper conductors, is obviously quite small.

Figure 10:
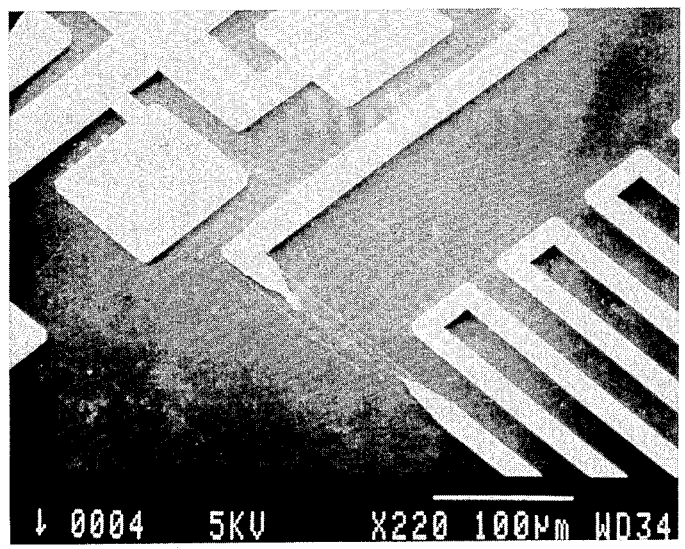

FIG. 10 shows a different conductor segment on the same sample as that shown in FIG. 9. Laser etching was performed under the same power and pulse conditions as before, except that here the sample was translated back and forth along a 50-μm length of the conductor, in 5-μm increments at time intervals of about 1 s, until the line was completely etched. This approach (a type of "direct erase") would be useful with laser direct-write technologies, where it might be necessary to route new, laser deposited conductor lines through an etched region, whose gap must be wider than that in FIG. 9. Note that there is no evidence of residual Ti in the etched region, nor is there evidence of damage to the underlying polyimide.

Thus, it was demonstrated that the present method, apparatus and solution for the laser-assisted, pyrolytic liquid-phase etching of copper conductors on polyimide dielectric, using a solution of sulfuric acid and hydrogen peroxide provides advantageous etching properties. For a 2% $H_2SO_4$/1% $H_2O_2$ etchant, a laser-assisted etch rate of 2.5 $\mu m/s$ was achived, while maintaining a background etch rate of about 1 $\mu m/hr$. An investigation of the etch rate temperature dependence for seven different formulations uncovered the low background etch rate of this particular composition. These etch rate measurements are consistent with prevailing models of electrochemical etching.

The present invention, therefore, is well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A process for laser-assisted liquid-phase etching of copper conductors, comprising the steps of:
   immersing a substrate having copper conductor lines on a dielectric in an etchant solution comprising sulfuric acid and hydrogen peroxide; and
   irradiatig select copper lines at select areas with a focused laser beam to etch said lines at said select areas.

2. A process as claimed in claim 1, wherein said solution comprises about 2–10% per volume of sulfuric acid and about 1–4% per volume of hydrogen peroxide.

3. A process as claimed in claim 2, wherein said solution comprises about two percent per volume of sulfuric acid and about one percent per volume of hydrogen peroxide.

4. A process as claimed in claim 2, wherein said solution comprises about ten percent per volume of sulfuric acid and about two percent per volume of hydrogen peroxide.

5. A process as claimed in claim 1, wherein said dielectric is selected from polyimide, epoxy, silicon dioxide or silicon nitride.

6. A process as claimed in claim 5, wherein said dielectric is polyimide.

7. A process as claimed in claim 1, comprising the further step of depositing metal unetchable in sulfuric acid/hydrogen peroxide on the sides of said lines to be irradiated prior to irradiation.

8. A process as claimed in claim 7, wherein said metal comprises titanium.

9. A process as claimed in claim 1, comprising the further step of placing a thermally conductive material unetchable in sulfuric acid/hydrogen peroxide between said conductor lines and said dielectric.

10. A process as claimed in claim 9, wherein said thermally conductive material comprises titanium.

11. A process as claimed in claim 1, wherein the wavelength of said laser beam is in the range from about 200–1400 nm.

12. A process as claimed in claim 1, wherein the wavelength of said laser beam is in the range from about 400–700 nm.

13. A process as claimed in claim 1, wherein said solution further comprises a copper corrosion inhibitor.

14. A process as claimed in claim 13, wherein said inhibitor is selected from ammonium-, potassium-, or sodium-thiocyanate.

15. A process as claimed in claim 1, wherein said solution further comprises a stabilization agent.

16. A process as claimed in claim 15, wherein said stabilization agent comprises hypoxanthine.

17. A copper etchant solution for etching copper in monolithic medium film multi-chip substrates, comprising about two percent per volume sulfuric acid and about one percent per volume hydrogen peroxide.

18. An apparatus for laser-assisted liquid-phase etching of integrated circuit copper conductors, comprising:
   means for providing a visible wavelength laser beam;
   shuttering means for shuttering said laser beam; a beam expander;
   a sample holder for receiving and retaining a workpiece;
   a microscope head positioned adjacent said workpiece;
   means for positioning during operation said microscope head relative to said workpiece;
   a first port having one end attached to said microscope head for receivng said laser beam and introducing said beam into said microscope head;
   a second port also attached to said microscope head for mounting a video camera;
   a third port also attached to said microscope head for introducing illumination to said sample holder; and
   computer means for positioning said sample holder in its x-y plane relative to said microscope head.

19. An apparatus as claimed in claim 18, further comprising means for cooling said sample holder below ambient temperature.

* * * * *

UNITED STATES PATENT OFFICE
CERTIFICATE OF CORRECTION

Patent No. 4,904,340                    Dated February 27, 1990

Inventor(s) Robert F. Miracky, et al.

It is certified that error appears in the above-identified patent and that said Letters Patent is hereby corrected as shown below:

```
Column 1, line 64, change "of" to --on--.
Column 2, line 19, after "of" delete --a--.
Column 3, line 53, change "FIG." to --FIGS.--.
Column 3, line 55, change "FIG." to --FIGS.--.
Column 4, line 43, change "cotains" to --contains--.

Column 5, line 48, change "ae" to --are--.
Column 6, line 12, change "dy" to --dye--.
Column 6, line 43, change "tem" to --tems--.
Column 6, line 45, delete the quotation mark and the hyphen
   following the quotation mark.
Column 6, line 46, change "medium-film"" to --"medium-film"--.
Column 6, line 46, change "means" to --mean--.
Column 6, line 52, change "taper" to --tape--.
Column 11, line 28, change "irradiatig" to --irradiating--.
Column 12, lines 31-32, make "a beam expander" a new
   paragraph.
```

Signed and Sealed this

Seventeenth Day of September, 1991

Attest:

HARRY F. MANBECK, JR.

*Attesting Officer*     *Commissioner of Patents and Trademarks*